United States Patent [19]

Liang et al.

[11] Patent Number: 5,233,131
[45] Date of Patent: Aug. 3, 1993

[54] INTEGRATED CIRCUIT DIE-TO-LEADFRAME INTERCONNECT ASSEMBLY SYSTEM

[75] Inventors: Louis H. Liang, Los Altos; Jon M. Long, Livermore, both of Calif.

[73] Assignee: VLSI Technology, Inc., San Jose, Calif.

[21] Appl. No.: 760,799

[22] Filed: Sep. 16, 1991

Related U.S. Application Data

[63] Continuation-in-part of Ser. No. 630,138, Dec. 19, 1990, abandoned.

[51] Int. Cl.$^5$ .......................................... H01L 23/495
[52] U.S. Cl. ...................................... 174/52.4; 29/827; 439/876
[58] Field of Search ............... 439/68, 70, 76, 79, 439/876; 174/52.4; 29/827, 839, 840, 841, 842, 843; 357/69, 70, 80, 74; 361/421

[56] References Cited

U.S. PATENT DOCUMENTS

| 3,158,418 | 11/1964 | Rush | 439/79 |
| 4,224,637 | 9/1980 | Hargis | 357/70 |
| 4,506,238 | 3/1985 | Endoh et al. | 174/52.4 |
| 4,628,148 | 12/1986 | Endou | 357/80 |
| 4,628,597 | 12/1986 | Meehan et al. | 29/827 |
| 4,640,010 | 2/1987 | Brown | 357/70 |
| 4,701,723 | 10/1987 | Kameya | 333/33 |
| 4,754,317 | 6/1988 | Comstock et al. | 357/70 |
| 4,766,478 | 8/1988 | Dennis | 357/70 |
| 4,774,635 | 9/1988 | Greenberg et al. | 361/421 |
| 4,785,533 | 11/1988 | Seino et al. | 174/52.4 |
| 4,818,821 | 4/1989 | Wentworth | 174/52.4 |
| 4,861,944 | 8/1989 | Jones, II et al. | 29/842 |
| 4,870,224 | 9/1989 | Smith et al. | 174/52.4 |
| 4,871,317 | 10/1989 | Jones | 29/840 |
| 4,873,615 | 10/1989 | Grabbe | 174/52.4 |
| 4,979,903 | 12/1990 | Gosselin | 439/885 |

FOREIGN PATENT DOCUMENTS 270184 7/1989 German Democratic Rep. ... 439/78

OTHER PUBLICATIONS

"Multi-Layer Molded Plastic Package," by D. Mallik, Intel Corp., (Table of Contents, pp. 2, 4, 6, 8).

Primary Examiner—Neil Abrams
Attorney, Agent, or Firm—Majestic, Parsons, Siebert & Hsue

[57] ABSTRACT

To bridge the gap between a semiconductor die and the leads of a leadframe, an insulating bridging and support member is used to support the die. The member has thereon conductive traces connected to the die. Provided in the interior portion of the member away from its edges are connecting structures such as holes, slots or grooves. The leads have bent end portions engaging the holes, slots or grooves. The bent end portions are soldered or otherwise connected to the inner surfaces of the holes, slots or grooves by soldering to electrically connect the leads to the traces and to physically attach the member to the leadframe. The above-described structure permits the bonding sites between adjacent leads to the member to be greater than lead spacing of the leadframe. The leads are in the shape of elongated rods of uniform cross-section to maximize the lead density possible around the bridging and support member.

23 Claims, 9 Drawing Sheets

INTEGRATED CIRCUIT DIE-TO-LEADFRAME INTERCONNECT ASSEMBLY SYSTEM

CROSS-REFERENCE TO RELATED APPLICATION

This application is a continuation-in-part application of Ser. No. 630,138 filed Dec. 19, 1990 and now abandoned.

BACKGROUND OF THE INVENTION

Leadframes have been commonly used in the packaging of integrated circuit dies because of their versatility and low cost. Typically, the leadframe is planar in construction and surrounds the integrated circuit semiconductor die. The leadframe is typically formed by stamping or etching a predetermined pattern of leads in a sheet of metal. The leadframe so processed typically includes at least two arrays of leads on opposite sides of a central area for accommodating the die. The leads typically have inner lead portions close to the die area for connection to the die and outer lead portions extending away from the die area. As described below, the leads are usually arranged so that the leads radiate from their outer lead portions inward towards the central die area to their inner lead portions.

Bonding wires are affixed to the inner lead portions and to selected contact pads on the die to electrically connect the die to the leads. The die is attached to and supported by a base (also known as a pad or paddle) which may simply be a portion of the leadframe where the portion is known as a die attach pad. To accommodate a large number of connections between the die contact pads and the leads, the pattern of leads formed in the leadframe is such that the leads form a converging pattern towards the die area where the cross-sectional dimensions and the spacing between adjacent leads become smaller from the outer lead portions towards the inner lead portions, so that the cross-sectional dimensions of the leads and the lead spacings are the smallest at the tips of the inner lead portions immediately adjacent to the die. Such conventional leadframe structure is illustrated in FIG. 1 of U.S. Pat. No. 4,774,635 to Greenberg et al.

The above-described standard packaging scheme utilizing leadframes generally has been satisfactory. However, with the advent of very large-scale integration, the pad pitch on semiconductor dies has been continually reduced. When this happens, the limitations of the above-described conventional packaging scheme become apparent. In the process for forming the leadframe by means of either stamping or etching as described above, the limitation of the stamping and etching processes sets a lower limit to the possible minimum widths of the leads and the spacing between the leads. Typically, the leads of a 6-mil thick (such as in PQFP) leadframe must be at least 6 mils wide and the minimum spacing between adjacent leads is 4 mils. Because of these minimum dimensions which must be maintained for the minimum dimensions of lead widths and lead spacings, in order to accommodate a large number of leads, the inner lead portions must end further away from the die than in previous designs with fewer lead connections. In other words, the bonding wires used to connect contact pads on the die and the inner lead portions of the leads must correspondingly be longer than those used previously.

If the bonding wires are too long, however, they tend to sag and sway, which increases the chances that adjacent bonding wires may contact to create electrical shorts. Sagging wires also increase the stresses at the joints from the bond wires to the leads at one end and to the die contact pads at the other. This increases the probability that wires will break at the joints. Bonding wires used therefore should not be of excessive length. In general, it is desirable to have the wires spanning less than 150 mils between the die contact pads and the leads. The same difficulties will be present where the size of the die is smaller than the standard chip sizes.

Various solutions have been proposed to solve the above-described problems. In U.S. Pat. No. 4,754,317 to Comstock et al., for example, a bridging member of annular square configuration is used to bridge the wide gap between the die and the inner lead portions. The bridging member has thereon transverse plated spaced conductive pathways. A first series of short bonding wires connect selected die contact pads to the inner ends of selected conductive pathways and a second concentric series of bonding wires connect the outer ends of the selected conductive pathways of the bridging member to selected ones of the inner leads of the leadframe. Such scheme is disadvantageous since an extra series of bonding wires is required. As is known to those skilled in the art, precisely affixing bonding wires to closely packed locations is time-consuming and difficult. Having to employ an extra series of bonding wires affixed to closely packed locations as required by Comstock et al. magnifies the problem.

Greenberg et al. proposes another solution in U.S. Pat. No. 4,774,635. In this solution, in order to bridge the wide gap between the die and the increased number of leads of the leadframe, conductive fingers backed by an insulating tape are aligned and bonded to the ends of the fingers of leads on the leadframe. The tape fingers are electrically coupled to the bond pads on the semiconductor die by wire bonding. In other words, the locations and the widths of the tape fingers must be such that these fingers are precisely aligned with the ends of the lead fingers of the leadframe. This requires an accurate alignment process. Furthermore, since the tape fingers must be precisely aligned with the lead fingers of the leadframe, the tapes have to be custom made for each type of leadframe. In other words, different types of tapes must be kept in stock for use with different types of leadframes, which is cumbersome and expensive.

Yet another solution is proposed by Smith et al. in U.S. Pat. No. 4,870,224. Smith et al. proposes the use of a ceramic substrate for supporting a semiconductor die and for bridging the gap between the leads of a leadframe and the contact pads on the die. Contacts are provided on the ceramic substrate to mate with the contact pads of the integrated circuit devices on the die. Conductive lines then couple the contacts on the ceramic substrate to the peripheral edges of the substrate. The ends of the conductive lines at the peripheral edges of the substrate then mate with a set of ends of the leads of a leadframe.

As discussed above, given the current state of the art in stamping or etching leadframes, the minimum spacing between adjacent leads of a leadframe is 4 mils. Since the leadframes are connected to the conductive lines on the ceramic substrate only at the peripheral edges of the substrate, the spacing between adjacent connection sites between the conductive lines and the leads also must be at least 4 mils. If conventional bonding tools are used for connecting the conductive lines to the leads, the bonding operation using the tool requires certain minimum space in order to perform the bonding operation. When the bonding sites are too close together, the conventional bonding tool cannot be used, and expensive single point welding equipment is required. Alternatively, conductive adhesive may be used in an expensive process.

Furthermore, in the design proposed by Smith et al., in order to connect the end portion of each lead to a peripheral edge of the ceramic substrate, the end portion of the lead comprises an upper finger and two lower fingers wherein the peripheral edge is disposed between the upper and lower fingers. As noted above, the stamping and etching processes for forming leadframes imposes lower limits for the widths of leads that can be formed to about 6 mils. This means that the three fingers of the end portion of each lead in Smith et al. must also be at least about 6 mils in width. Therefore, using Smith et al.'s design, each connection between a lead of the leadframe and a conductive line would occupy an extra 12 mils of space at the peripheral edge of the substrate more than it would require in other designs; this vastly reduces the number of connections possible between the die and the leadframe.

None of the above-described proposed solutions is entirely satisfactory. It is therefore desirable to provide an improved die-to-leadframe interconnect assembly at which the above difficulties are alleviated.

SUMMARY OF THE INVENTION

This invention is based on the observation that the design proposed by Smith et al. can be improved in various aspects to arrive at a much more advantageous die-to-leadframe interconnect assembly. In the design by Smith et al., the locations for connections between the substrate and the leads, or bonding sites, are limited to the peripheral edges of the substrate. This means that the bonding between each lead and the substrate must be accomplished within a space equal to the lead spacing between adjacent leads. As indicated above, when the bonding sites are too close together, conventional bonding tools cannot be used, and expensive single point welding equipment or expensive conductive adhesives must be used. This invention is based on the observation that, by making it possible to connect the leads to the interior portions of the substrate, the spacing between adjacent bonding sites need not be equal to the spacing between adjacent lead spacings; in fact, the distance between adjacent connection or bonding sites may be much greater than the lead spacing. In this manner, conventional bonding tools may be used even though the minimum possible spacing between adjacent leads, such as 10 mils, is maintained between adjacent leads. Thus, in the preferred embodiment, in order to increase the spacing between adjacent connection or bonding sites, the substrate has a plurality of connecting structures forming a staggered arrangement near each of the edges of the substrate.

In the preferred embodiment, the leads are in the shape of unitary elongated rods, thereby avoiding the forked lead end design of Smith et al. By using the unitary elongated rod design for the leads, the lead density that can be accommodated by a given size substrate is vastly increased compared to Smith et al.'s design using a forked lead end design.

One aspect of the invention is directed towards an integrated circuit die-to-leadframe interconnect assembly comprising a semiconductor die, and a leadframe having a plurality of electrically conductive leads. The assembly also includes an insulating bridging and support member or substrate supporting the die so that the die is separated from the leads by gaps, said member having electrically conductive traces for bridging the gaps. The assembly also includes means for electrically connecting the traces to the die. The member has edges between the die and the leads and a plurality of connecting structures in the interior portions of the member. Each structure is located in an interior portion of the member. Each structure is electrically connected to a trace and electrically connected to and attached to a corresponding lead so that the die and the member are supported by the leadframe, so that the die is electrically connected to the leads. In the preferred embodiment, for at least one edge, the structures are located adjacent to said one edge at different distances from said one edge forming a staggered arrangement.

Another aspect of the invention is directed towards a method for interconnecting an integrated circuit die to a leadframe. The method comprises forming a leadframe with at least one array of leads, each lead having a bent end. The array has leads adjacent to one another and extending in a direction at staggered distances between adjacent leads so that the bent ends form a staggered arrangement. The method comprises providing a member with edges and with electrically conductive traces and a plurality of connecting structures. Each structure is electrically connected to a trace, wherein for at least one edge, the structures are located adjacent to said one edge at different distances from said one edge forming a staggered arrangement that is substantially the same as the same staggered arrangement of the bent ends. The method also includes aligning the leadframe and the member so that each structure matches location of a corresponding bent end, moving the leadframe or the member so that each structure is in contact with its corresponding bent lead end, attaching and electrically connecting each lead end to its corresponding structure, attaching the die onto the member, and electrically connecting the die to the traces on the member.

DETAILED DESCRIPTION OF THE PREFERRED EMBODIMENT

Figure 1:
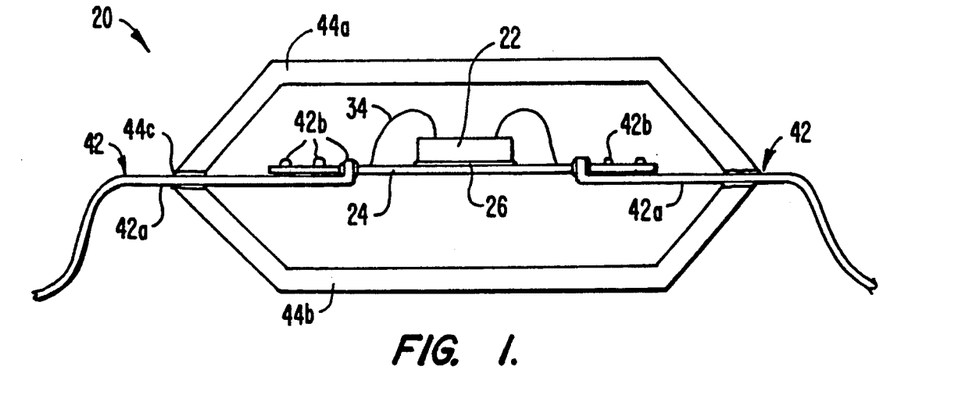
FIG. 1 is a cross-sectional view of a clamshell-type semiconductor package employing leads of a leadframe to illustrate a first embodiment of the invention.

As shown in FIG. 1, package 20 includes a die 22 which is supported by a member or substrate 24 and attached to substrate by an adhesive such as an epoxy 26. Substrate 24 has conductive paths or traces 32 on its upper surface. While the conductive paths or traces in the various figures are shown on the surface of the substrate, it will be understood that the paths or traces may be within the interior portion of the substrate or partly within the interior and partly on the surface of the substrate; all such variations are within the scope of the invention. The bond pads (not shown in FIG. 1) on the die 22 are then connected to these conductive traces 32 (not shown in FIG. 1) by means of bond wires 34. While a clam shell type housing is shown in FIG. 1, it will be understood that the invention is applicable in a similar manner to transfer or injection molded packages or packages with housing made of a potting material.

The structure of the member or substrate 24 and the conductive traces thereon are more clearly shown in FIG. 2, which is a top view of the package 20 of FIG. 1 with the housing (described below) removed, and end portions of the leads in the top and bottom arrays omitted for simplicity. Substrate 24 is provided in its interior portion with a plurality of holes 36 located in the vicinity of the conductive traces 32. To simplify the drawing and for clarity, most of the conductive traces 32 have been omitted from FIG. 2. In reference to FIGS. 1 and 2, the leads 42 each comprises an elongated main body portion 42a and an end portion 42b. The end portion 42b is shown more clearly in FIG. 12. The end portion 42b, in the preferred embodiment, is connected at substantially right angles to the main body portion 42a. The relative sizes of holes 36 and end portions 42b are such that the end portions may be inserted into the holes 36 while leaving sufficient room for solder between the surfaces of end portions 42b and holes 36 to securely connect leads 42 to the substrate 24.

Holes 36 and other connecting structures such as slots and grooves or shoulders described below are located at interior portions of the substrate 24, so that the spacing between bonding sites of the end portions 42b to the structures is not limited to the lead spacing of leads 42. In this context, interior portions of the substrate means portions of the substrate that are not its edges. In the preferred embodiment, the connecting structures such as holes, slots, grooves are spaced apart from one edge of the substrate but are at different distances from such edge. The structures are preferably arranged in one or more rows parallel to such edge with adjacent rows offset with respect to one another forming a staggered arrangement. A similar arrangement may be employed for each of the four edges of the substrate.

Conductive traces 32 are located at the immediate vicinity of holes 36 so that the soldering of the end portions 42b to holes 36 will also electrically connect a lead 42 to the respective conductive trace 32. Preferably, the conductive trace adjacent to a hole 36 actually forms a portion of the surface (not shown) of the hole 36 so that soldering of the hole surface to a lead will electrically connect such conductive trace to the lead. After the soldering, the assembled package described above is enclosed by upper half 44a and lower half 44b of a housing in a conventional manner to hermetically seal the above-described structure except for portions of the leads 42 from the outside environment. The joint between the upper and lower housing portions are labeled 44c in FIG. 1; the corresponding location of such joint is indicated in dotted lines and labeled 44c in FIG. 2. While the above described assembled package is shown in FIG. 1 as enclosed by a clamshell type housing, it will be understood that it may be enclosed without any internal cavity such as shown in FIG. 1 by a packaging material such as plastic or other potting material put in place by a molding process such as injection molding or transfer molding. All such variations are within the scope of the invention.

Figure 10:
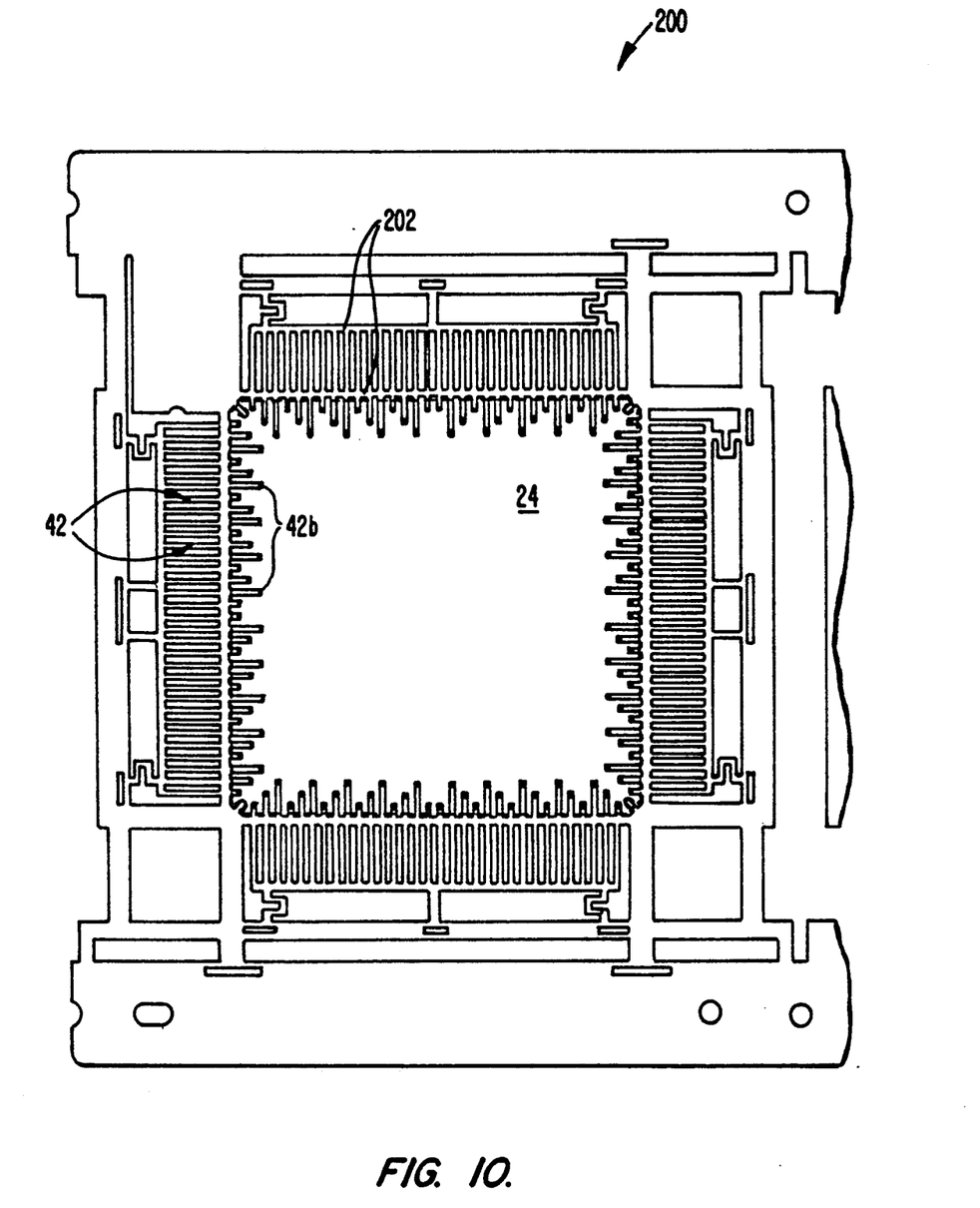
FIG. 10 is a bottom view of a portion of a leadframe containing the integrated circuit die-to-leadframe interconnect assembly of FIG. 2.

The interconnect apparatus described above has a number of advantages. Since the end portion 42b is at an angle different from 180° to the main body portion 42a, it is possible to connect each lead to an interior portion of the substrate. In other words, in contrast to the design of the Smith et al. described above where the connections between the conductive paths of the substrate to the leads are limited to the edges of the substrate, the leads may now be connected to these conductive traces at interior portions of the substrate in this invention. This permits adjacent holes 36 to be spaced apart by distances much greater than the lead spacing, such as the minimum lead spacing of 10 mils. In the embodiment of FIGS. 2 and 10, for example, the distance between adjacent holes 36 is about 1.4 times the lead spacing of the leadframe. Obviously, the separation between adjacent holes 36 can be further increased to more than 1.4 times the lead spacing if desired.

Figure 2:
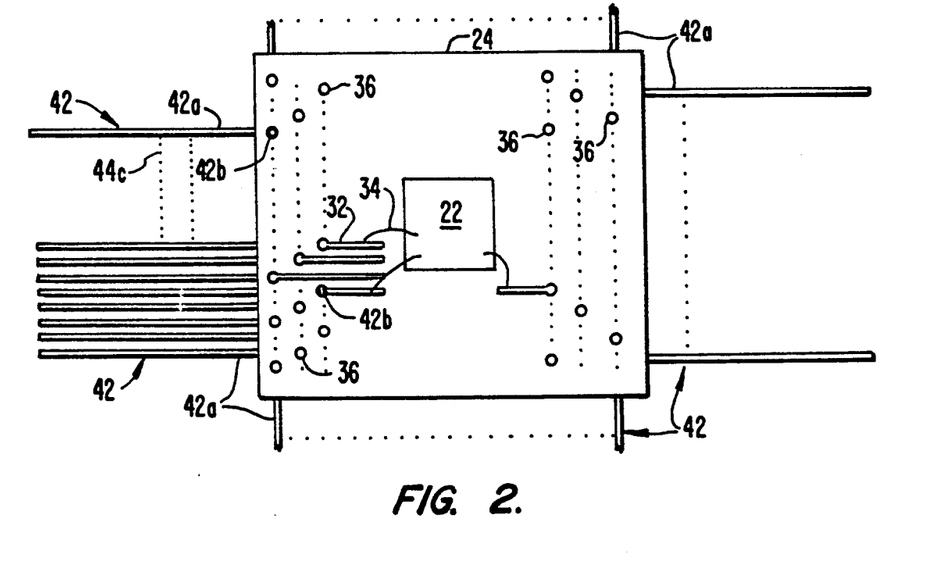
FIG. 2 is a top view of the package of FIG. 1 but with the housing of the pacl age removed and portions of the outer ends of leads omitted to illustrate the first embodiment of the invention.

Since adjacent bonding sites to lead ends 42b can be and are generally spaced further apart compared to the lead spacing in this invention, the design of FIGS. 2 and 10 makes the bonding process much easier than that of Smith et al.'s and allows conventional bonding tools to be used rather than the expensive single point welding or the expensive conductive adhesive process. This is the case particularly where the lead spacing of the leadframe is small, such as 10 mils.

Furthermore, as shown in FIGS. 2 and 10, leads 42 are in the shape of straight elongated unitary rods, each with a bent end 42b. Therefore, the forked configuration of Smith et al. is avoided so that the spacing between adjacent leads can be reduced compared to the design of Smith et al.

The use of connecting structures such as holes 36 (and of shoulders of FIGS. 3A-3C, 4 and of slots in FIG. 5) facilitates the process of soldering. In order to solder the end portions 42b to the connecting structures such as holes 36, portions of the traces and portions of the inner surfaces of the holes 36 may be masked by a layer of solder resist. Furthermore, since the soldering is performed between the lead and a surface of the hole (or a slot or shoulder) in a substrate, the probability that a solder will overflow to create electrical shorts with an adjacent lead is reduced. This is the case since the spacing between the end portion 42b at a surface of hole 36 (or slot or shoulder) is used to accommodate the solder. Surface tension effects by the two annular surfaces of the end portion and of the hole tend to join the solder to the surfaces in a localized area. In contrast, in conventional designs where a lead is soldered to a flat planar surface, the same amount of solder must be spread out over a much larger portion of the planar surface of the conventional interposer so that the same volume of solder used will be spread over a much larger area. Since the solder used will be much more localized compared to conventional designs, it is possible for holes 36 to be packed to a higher density not achievable in conventional systems.

Figure 3A:
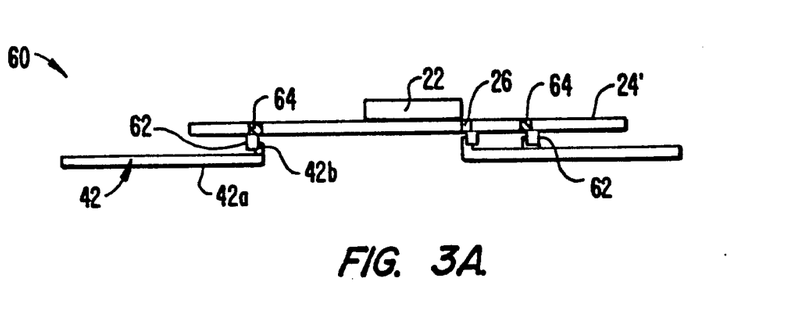
FIGS. 3A, 3B are cross-sectional views of a semiconductor die, a substrate, and lead portions to illustrate a second embodiment of the invention.
Figure 3B:
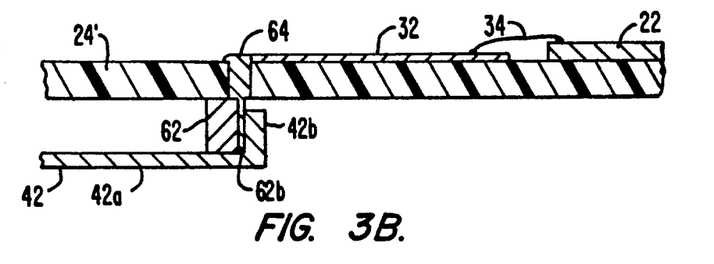
Figure 3C:
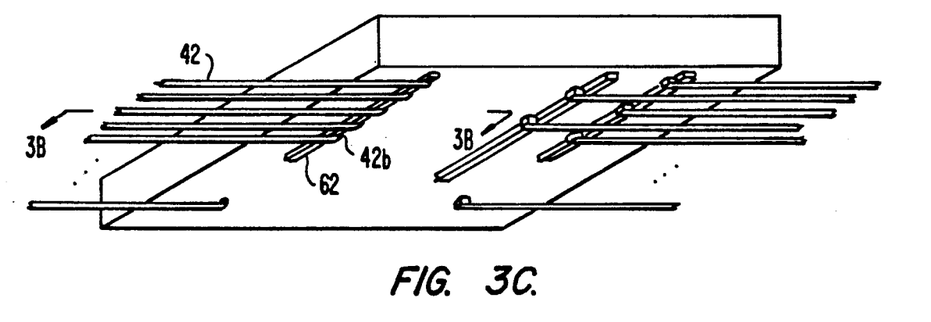
FIG. 3C is a bottom perspective view of the structure of FIGS. 3A, 3B.
Figure 4:
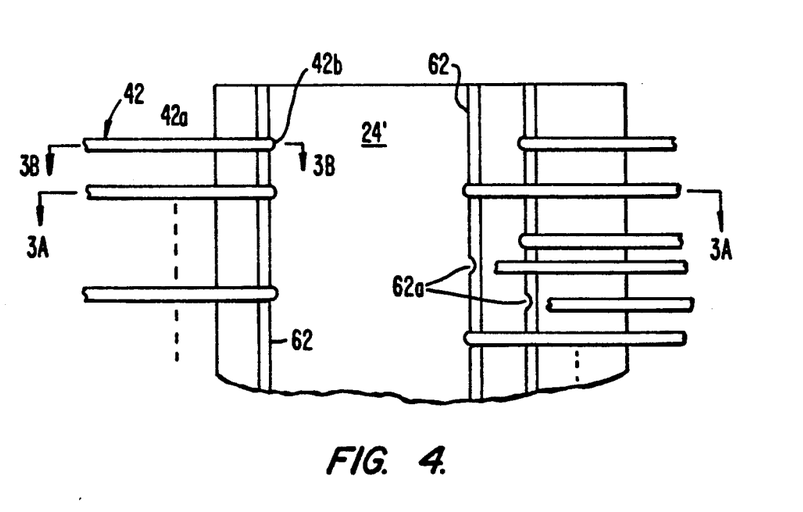
FIG. 4 is a bottom view of a portion of the structure of FIGS. 3A–3C.

FIGS. 3A, 3B are cross-sectional views of a semiconductor die, and lead portions to illustrate a second embodiment of the invention. For ease of description, identical parts in this application are numbered by the same numerals in the figures. To simplify the drawing, the bonding wires connecting the die 22 to conductive traces on the substrate have been omitted from FIG. 3A, 3B. For simplicity, connections in FIGS. 3B, 3C, 4 are shown on only two sides of substrate or member 24', it being understood that the same connections may be made on all four sides of substrate 24'. Such configuration is part of the invention.

As shown in FIGS. 3A, 3B, the die 22 is again supported by and attached to member or substrate 24' by epoxy 26. Different from substrate 24 of FIGS. 1 and 2, the substrate 24' of FIG. 3 has no holes therein; instead, it is provided with electrically insulating bars 62 for connection with the lead end portions 42b. FIG. 3C is a perspective view of the apparatus 60 of FIGS. 3A, 3B. FIG. 4 is a bottom view of apparatus 60. FIG. 3B is a cross-sectional view of the apparatus 60 of FIGS. 3C, 4 along the line 3B—3B. In reference to FIGS. 3A-3C and 4, bars 62 attached to or forming an integral part of substrate 24' are provided with grooves 62a therein as shown in FIG. 4. The lead end portions 42b would fit against such grooves 62a where the lead end portion may be soldered to the surface of the groove 62a to physically attach the leads to the substrate and to electrically connect the lead to conductive traces in substrate 24'. As shown in FIG. 3A, 3B, electrically conductive vias 64 through the substrate 24' is used to electrically connect the lead end portions 42b to conductive traces 32 on the top surface of substrate 24 '. Vias 64 is located immediately adjacent to or preferably forms a portion 62b of the surface of the grooves 62a to accomplish such electrical connection. While grooves are used in the second embodiment to facilitate the alignment of leads to vias 64, it will be understood that grooves may be omitted if desired and the leads simply placed in abutment against shoulders of the bars 62 in the vicinity of the vias; all such variations are within the scope of the invention.

Figure 5:
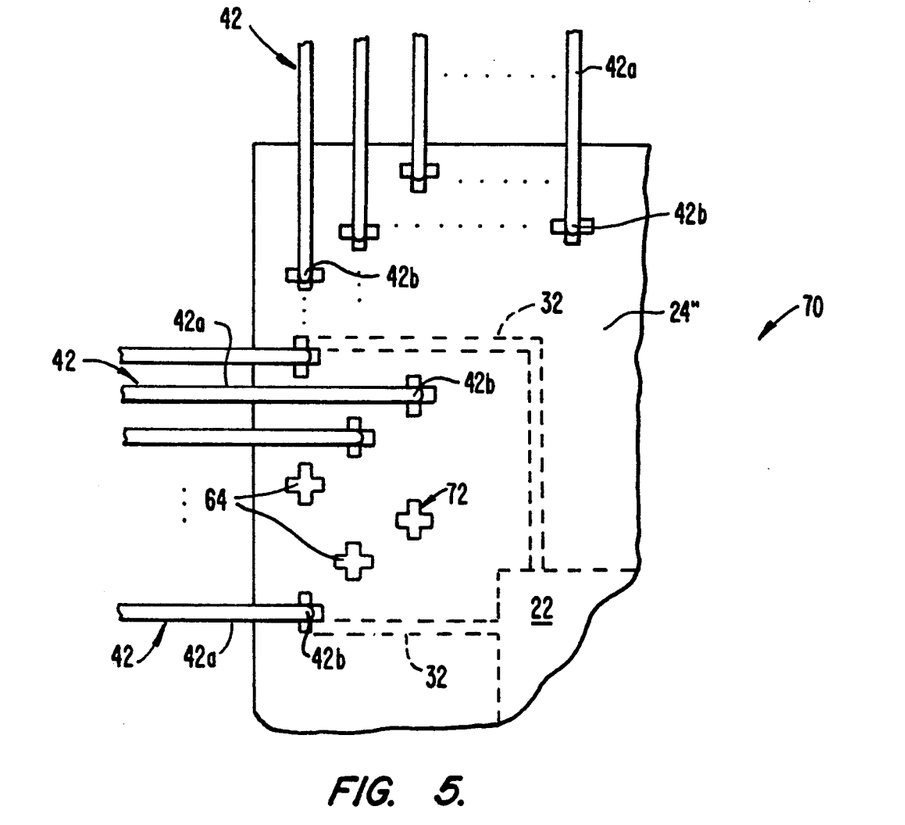
FIG. 5 is the bottom view of a corner portion of a substrate, a semiconductor die, and lead portions to illustrate a third embodiment of the invention.

FIG. 5 is the bottom view of a cut away portion of a substrate and lead portions to illustrate a third embodiment of the invention. In FIG. 5, the die 22 and representative conductive paths or traces 32 are shown in dotted lines since they are located on the top surface of the substrate. As shown in FIG. 5, instead of having bars or holes therein, member or substrate 24" is provided with slots 72 adapted to receive the lead end portions 42b. While slots 72 are shown as "cross"-shaped, it will be understood that slots of other shapes may be used as well and are part of the invention. Again vias 64 are provided immediately adjacent to or on top of the slots to electrically connect leads 42 to conductive traces 32, which may be similar to vias 64 of FIG. 3. Again, preferably these vias would form a portion of the surface of slots 72.

Figure 6:
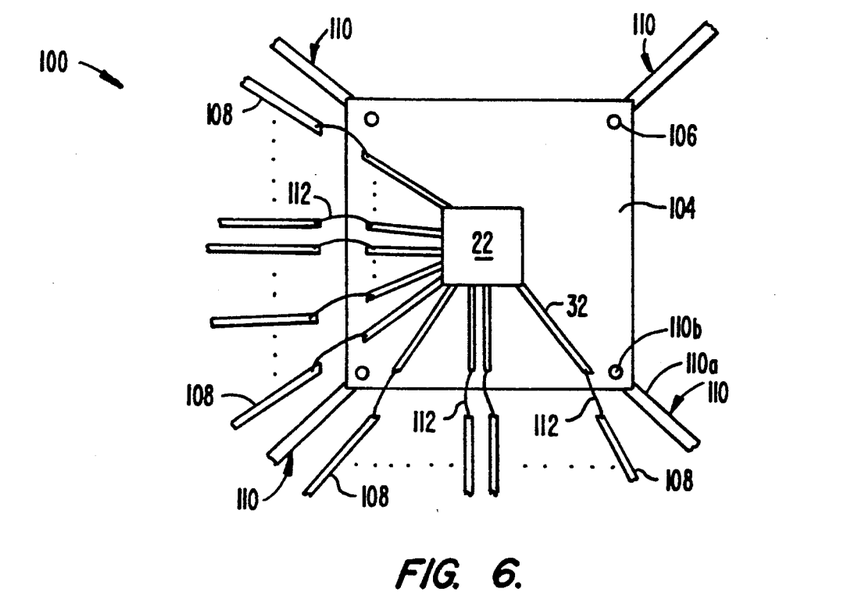
FIG. 6 is a top view of a substrate, a semiconductor die, and lead portions to illustrate a fourth embodiment of the invention.

FIG. 6 is a top view of a semiconductor package with the housing removed to illustrate a fourth embodiment of the invention. As shown in FIG. 6, package 100 includes a flexible substrate 104 with conductive traces 32 thereon and four holes 106 at the four corners. The leadframe includes conventional-type leads 108 and four tie bars 110. Each tie bar includes a main body portion 110a and an end portion 110b where the end portion is connected to the main body portion at an angle other than 180°. The end portions 110b fit into holes 106 where the end portion is soldered to the inside surface of the hole 106. In this manner the four tie bars hold the flexible substrate 104 in position and stretches it in order to support the die 22 and to align leads 108 with respect to the conductive traces 32. As indicated above, the substrates or members described above (24, 24', 24", 104) all provide conductive traces to reduce the distance that has to be bridged by bonding wires so that bonding wires of optimal length may be used. Thus the bonding wires 34 and 112 used may be of optimal length. As shown in FIG. 6, substrate 104 may be of the type used in TAB where traces 32 are connected directly to the bond pads of the die 22 where the die is placed with its active circuitry and bond pads facing the substrate 104. The bond pads are then bonded to contacts (not shown) on the substrate by solder material or thermal compression bonding. The substrate may be a flexible or rigid printed circuit board or a polyamide tape.

In the embodiment of FIG. 6, the tie bars 110 perform the alignment function without electrically connecting the tie bars to the die 22. Instead, the tie bars merely perform an alignment function to align leads 108 to traces 32. In contrast, in the embodiments of FIGS. 1-5, the leads 42 aligned the substrate 24 with respect to the leads and leadframe as well as provide the electrical connection between the die and other electronic devices connected to the leads.

In the description above, substrate 104 is described as flexible. It will be evident to those skilled in the art that even when substrate 104 is not flexible, the same arrangement illustrated in FIG. 6 and described above may be used in exactly the same manner. The holes 106 may also be replaced by the alignment structures (bars 62, slots 72) of FIGS. 3-5 for connection with tie bars 110.

Figure 7:
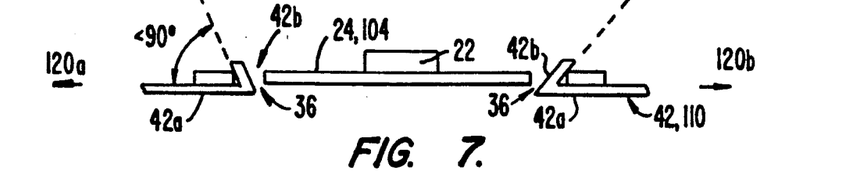
FIGS. 7-9 are cross-sectional views of a semiconductor die, a substrate, and lead portions to illustrate the different shapes of the lead end portions which may be used in the different embodiments of the invention.
Figure 8:
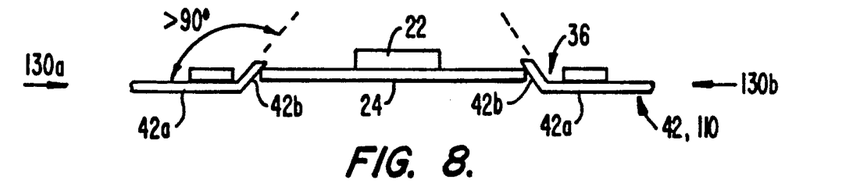

While in FIGS. 1-6, the lead end portions 42b are shown as essentially perpendicular to the main body portions 42a, it will be understood that this is not required and that the end portions 42b may be connected to the main body portions 42a at angles other than at right angles as illustrated in FIGS. 7 and 8. Thus as shown in FIG. 7, the lead end portions 42b forms an angle of less than 90° with the main body portion 42a. In such configuration, in order for the leads 42 to hold the substrates in place during the package assembly process, the leads located on opposite sides of the substrate are pulled away from one another along directions 120a, 120b where the lead end portions 42b would contact the surface of the hole 36 close to the edge of the substrate. In contrast, in FIG. 8, the end portions 42b would form an angle greater than 90° with the main body portion 42a. In such event, the leads located on opposite sides of the substrate are pushed towards one another along directions 130a, 130b in order to hold the substrate in place for package assembly. In such event, the end portions 42b would contact the surfaces of holes 36 away from the edges of the substrate 24 as shown in FIG. 8. While in FIGS. 7 and 8, the different angles made by the end portions 42b to main body portion are illustrated with respect to the substrate 24 of FIGS. 1 and 2 using holes as alignment structures, it will be understood that such configurations of leads may be used in conjunction with the alignment structures (bars, slots) of substrates 24', 24" of FIGS. 3-5 as well; all such variations are within the scope of the invention.

Figure 9:
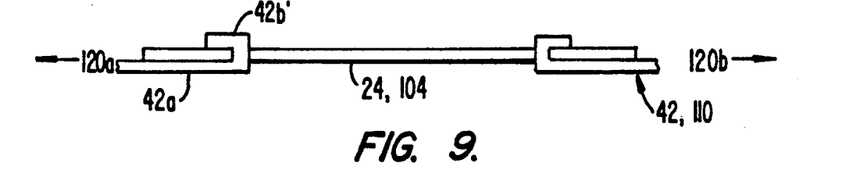

Illustrated in FIG. 9 is yet another configuration of leads 42 which may be used in conjunction with any of the embodiments in the invention. As shown in FIG. 9, the end portion 42b' forms a J-shaped structure with the main body portion 42a. The configuration of FIG. 9 has the advantage that the portion of the end portion on top of substrate 24 may be pressed down into electrical contact with the conductive traces on substrate 24 so that soldering is not necessary. This is particularly the case where the conductive trace and end portion 42b' are made of the same material such as gold. Furthermore, the J-shaped end portion of the leads will provide a sturdier connection between the leads and the substrate during package assembly.

Where the substrate is flexible (e.g. made of polyamide) such as in FIG. 6, alignment and connecting structures are provided on opposite sides of the die for connection with leads located on opposite sides of the substrate. In this manner, after the leads are connected to the connecting structures, the flexible substrate is suspended and maintained in position by the two sets of leads located on opposite sides of the substrate. While FIGS. 7-9 are described with respect to leads 42, it will be understood that the same arrangements may be used for connecting the tie bars 110 to the flexible substrate 104 as well, as shown in FIGS. 7 and 9. Since the substrate is flexible, the tie bars 110 should be pulled along directions 120a, 120b in order to stretch the substrate and hold it taut in order to support the die.

Figure 11:
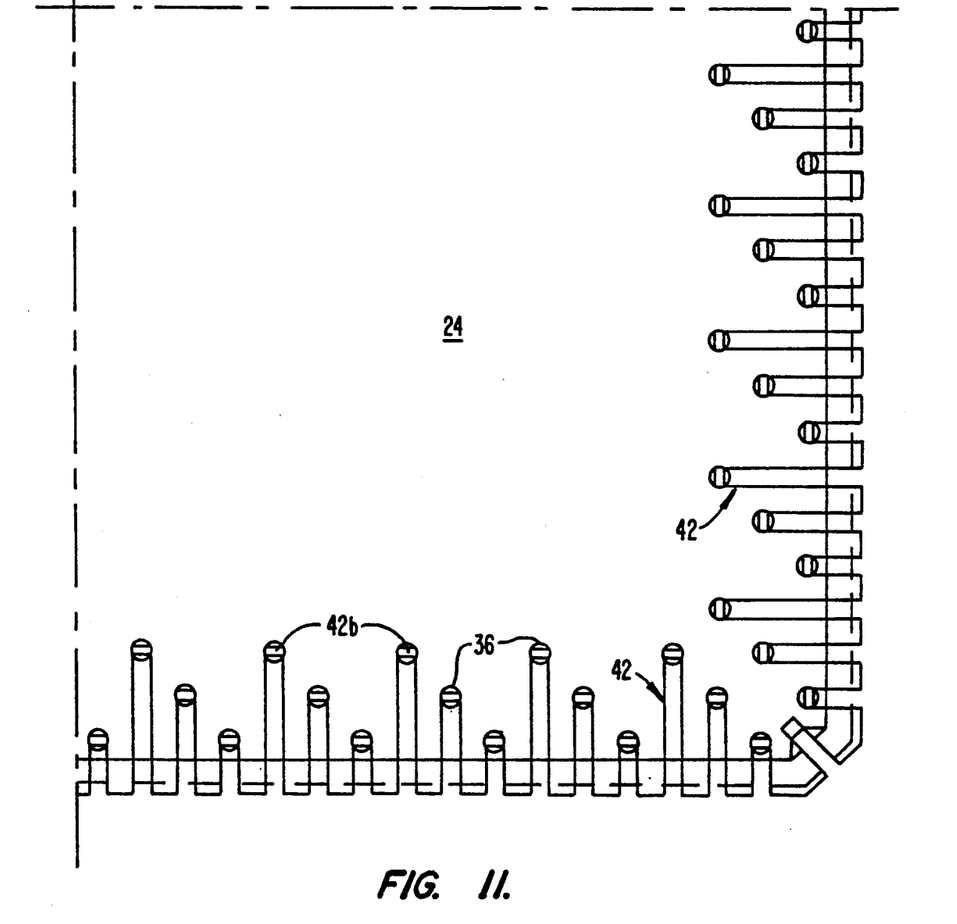
FIG. 11 is an enlarged view of one quadrant of the integrated circuit die-to-leadframe interconnect assembly of FIG. 10.
Figure 12:
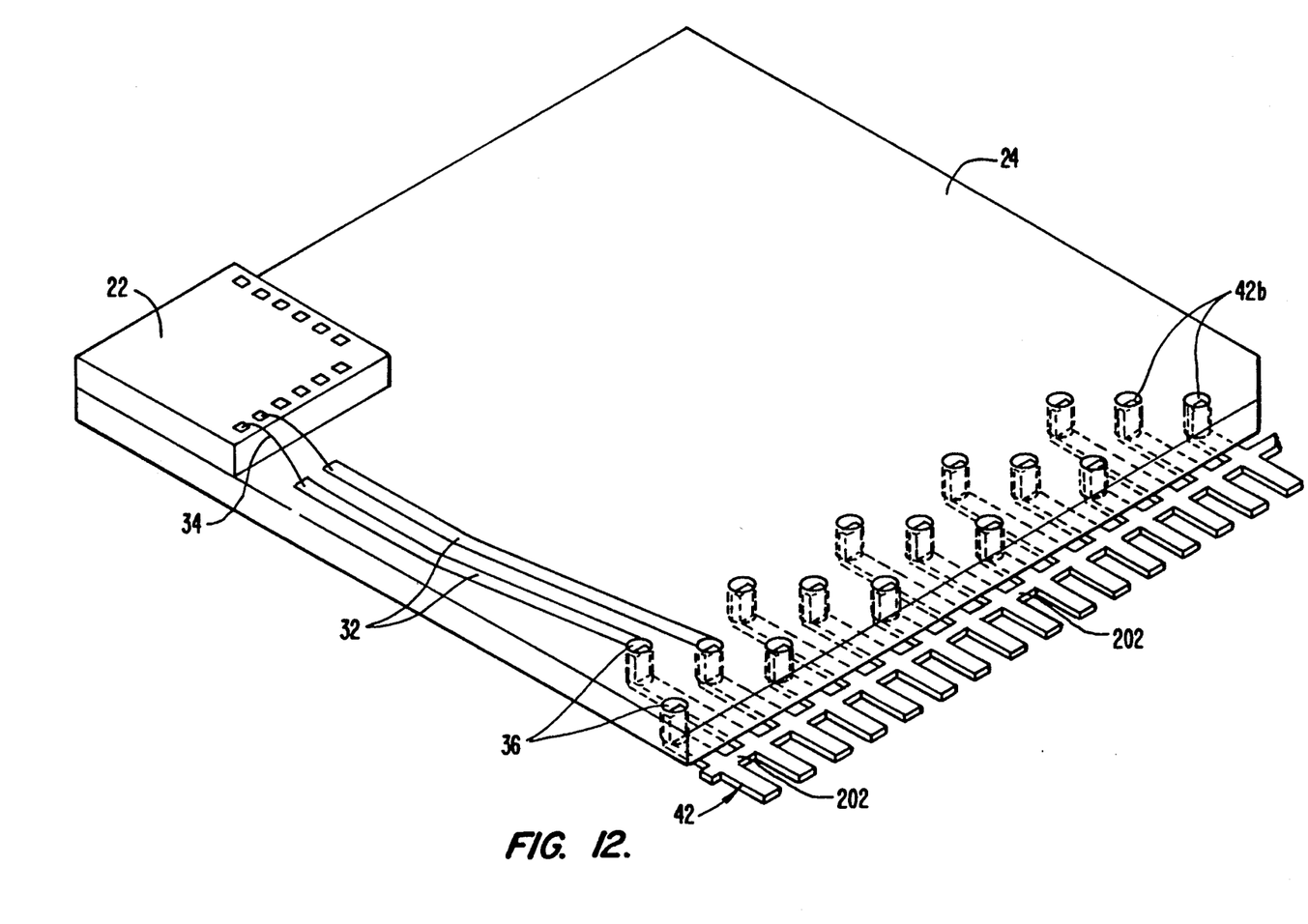
FIG. 12 is a perspective view of one quadrant portion of the assembly of FIG. 10.
Figure 13:
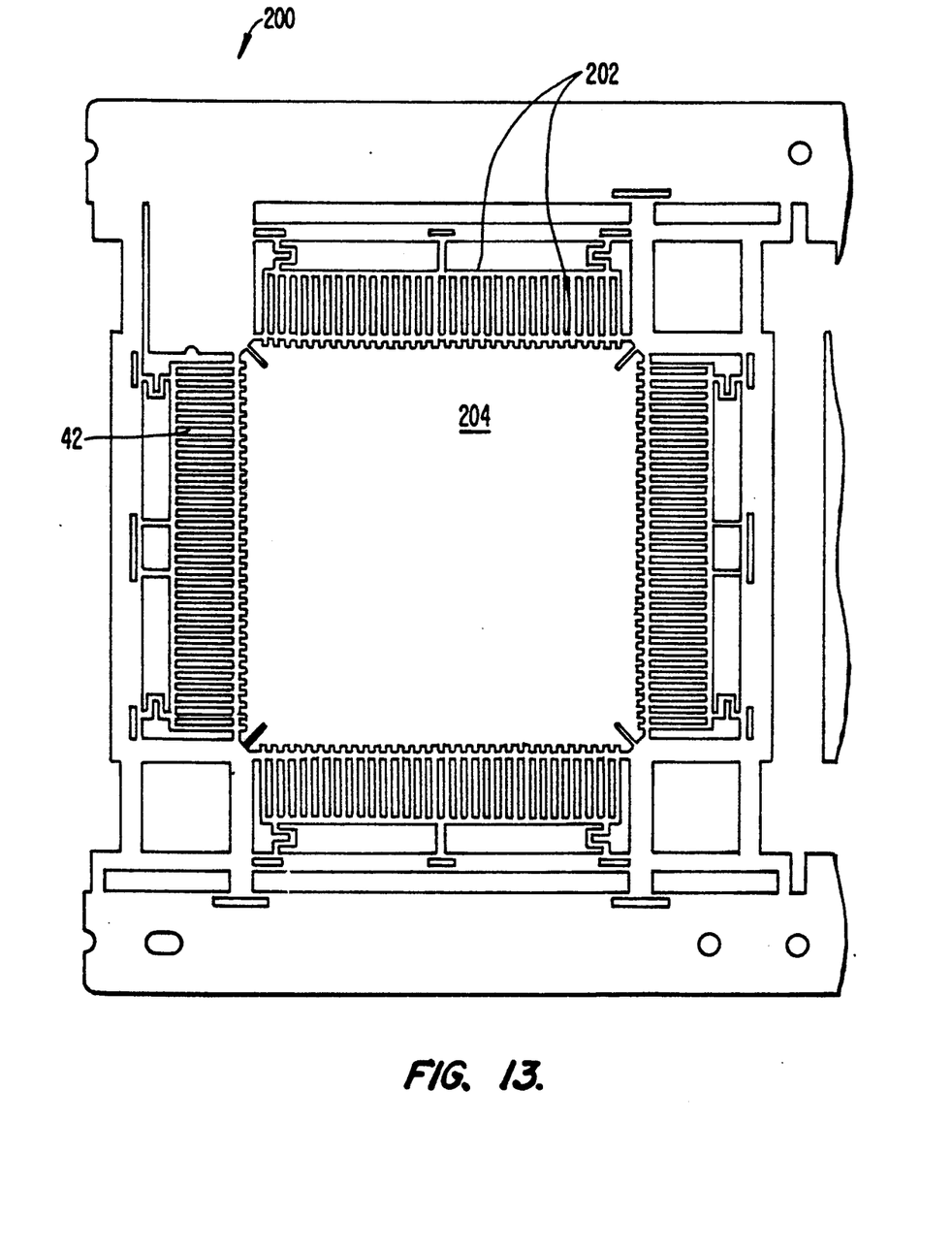
FIG. 13 is a top view of the leadframe of FIG. 10 where a portion of the leads, the bridging and support member and the die have been enclosed within a package body.

FIG. 10 is a bottom view of a leadframe having leads with bent ends and of a bridging and support member or substrate with holes therein into which the bent ends of the leads of the leadframe are inserted to illustrate the preferred embodiment of the invention. In other words, FIG. 10 illustrates, in addition to the structure of FIG. 2, the remaining portion of the leadframe 200 which supports the leads 42 of FIG. 2. Bars 202 are provided in leadframe 200 to facilitate the packaging process. FIG. 11 is an enlarged view of one quadrant of the member or substrate 24 and of the associated portions of the leads, showing in more detail the bent ends 42b of the leads and the relationship to holes 36 into which they have been inserted. FIG. 12 is a perspective view of a quadrant of the bridging and support member 24 and of the die 22 illustrating in more detail the connections between the die, the member and the lead ends 42b. Thus in reference to FIGS. 14A, 14C and FIGS. 10-13, the method of this invention is illustrated.

Figure 14A:
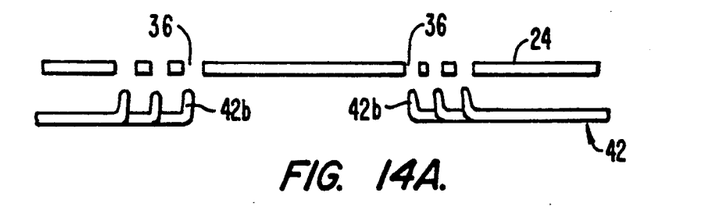
FIGS. 14A-14C are schematic views of the bridging member or substrate and portions of the leadframe to illustrate a method for connecting an integrated circuit die to a leadframe via the member.
Figure 14B:
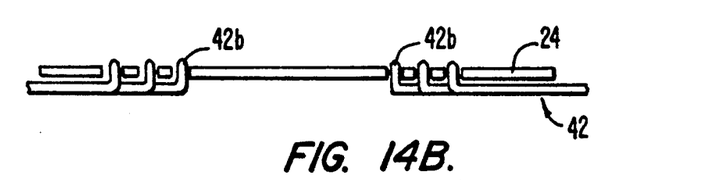
Figure 14C:
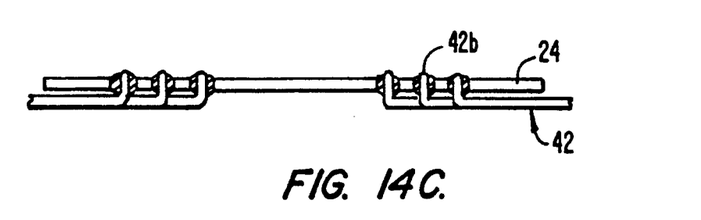

FIGS. 14A-14C are schematic views of member or substrate 24 and the leads portion 42 of the leadframe 200 to illustrate the method of this invention. As shown in FIG. 14A, first an insulating bridging and support member 24 is provided along with a leadframe 200 which has been stamped into a form illustrated in FIG. 10. The bent lead ends may be formed in a stamping or coining process. Such method of bending a portion of the lead in the stamping or coining process is known to those skilled in the art. As shown in FIG. 14A, the holes 36 (or any other type of connecting structures described above) are each aligned with a corresponding bent lead end 42b as shown in FIG. 14A. Relative motion is caused between the bent lead ends and the member or substrate 24 in order to either insert the bent lead ends into the holes (or slots or grooves) as shown in FIG. 14B. The resulting structure is illustrated in FIGS. 10 and 11. The bent lead ends are then soldered to the inner surfaces of the holes 36, as shown in FIG. 14C.

Then the die is attached on top of member or substrate 24 and bonding wires are used to connect contact pads on the die to conductive traces 32 on the member or substrate 24 as illustrated in FIG. 12. The inner ends of the leads 42, member or substrate 24, bonding wires 34 and the die 22 are then encapsulated in a package body 204 shown in FIG. 13. Leads 42 are then severed from the leadframe 200 and bars 202 removed to disconnect the leads from one another. The leads are then formed into a shape such as shown in FIG. 1 in a surface mount configuration so that the leads may be readily mounted and connected to contacts on a flat surface.

FIGS. 10-13 illustrate a number of particularly desirable features of the invention. As shown in these figures, the connecting structures (in this case holes 36) include three rows of structures, each row being substantially parallel to the edge adjacent to the structures. Obviously, more or fewer rows of structures may be employed. As shown in FIG. 10, member or substrate 24 has a staggered array of such structures adjacent to each of the four edges. As indicated above, leads 42 are in the shape of unitary straight elongated rods with a uniform cross-section. The cross-sectional dimensions of the rods are preferably not larger than about 0.5 mm or 20 mils. To accommodate the bent lead ends, the cross-sectional dimensions of the holes 36, slots 72, and grooves 62a are in the range of about 6 to 20 mils.

While soldering the bent lead ends to the connecting structures on the member or substrate 24 may be satisfactory, other types of bonding methods may also be used, including compression bonds. Still another advantageous bonding method that can be used in this context is an interconnect structure described in U.S. patent application Ser. No. 631,802, filed Dec. 20, 1990, now abandoned in favor of Ser. No. 919,620, filed Jul. 24, 1992 and assigned to the same assignee as this application. Such method is illustrated by reference to FIGS.

Figure 15:
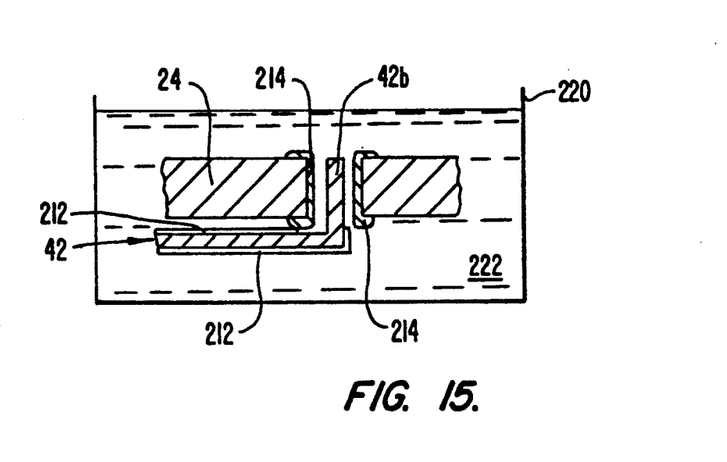
FIG. 15 is a schematic view of an electrodeless bath and a cross-sectional view of a portion of the bridging and support member and of a bent lead end submerged in the bath to illustrate one embodiment of the method of this invention.
Figure 16:
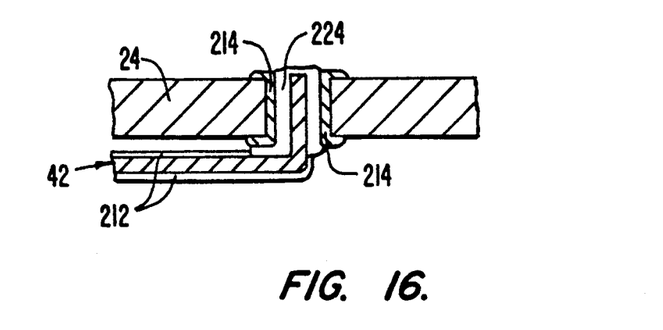
FIG. 16 shows the portion of the member and of the lead end of FIG. 15 and of the metal connection between the lead end and the metal coating in a through hole of the member to illustrate the invention.

15 and 16. As shown in FIG. 15, except for the bent lead end 42b, the remaining portion of lead 42 is covered by a protective layer 212. The surface of the connecting structure (such as the inner surface of hole 36) is covered by a metallic layer 214, such as a layer of copper or other metals. Then the bent lead end 42b is placed in the vicinity of the connecting structure, such as by inserting into hole 36. The bent lead end and member or substrate 24 are then placed in an electrodeless bath 220 having an aqueous metal solution 222. The solution may be composed of nickel, copper, cobalt, palladium, platinum, silver or gold so that an interconnect structure 224 will be formed between the bent lead end 42b and the metallic layer 21 as shown in FIG. 16. The interconnect structure is formed when copper atoms in the lead give up electrons and the aqueous metal solution receives the electrons and plates onto the copper. If the metallic layer 214 is made of aluminum, the solution similarly plates onto the aluminum and forms the interconnect structure 224 which is electrically conductive and electrically connects as well as physically attaches bent lead end 42b, the connecting structure member or substrate 24. If bent lead end 42b is made of a metal such as copper, then the interconnect structure will also form on the bent lead end as well.

Figure 17:
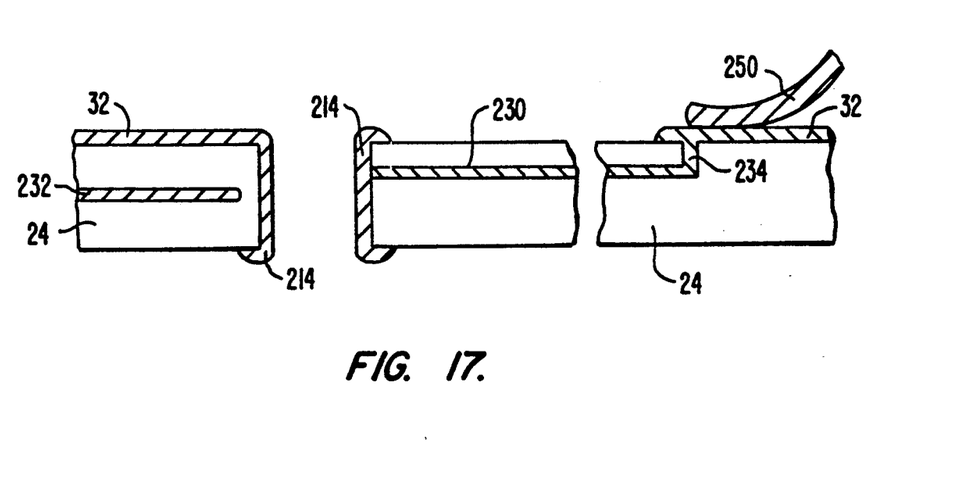
FIG. 17 is a cross-sectional view of a portion of the bridging and support member of FIGS. 2 and 10 and of a bonding wire to illustrate the invention.

FIG. 17 is a cross-sectional view of a portion of member or substrate 24 and a portion of a bonding wire to illustrate the preferred embodiment of the invention. As shown in FIG. 17, member or substrate 24 may have embedded therein one or more conductive planes 230, 232 to serve as conductive planes such as power or ground planes. As shown in FIG. 17, plane 230 is connected to the metallic layer 214 as well as to trace 32 through via 234. Trace 32 is in turn connected to bonding wire 250 connected to a contact pad on the die (not shown). In this manner, plane 230 connects metallic layer 214 to the die through bonding wire 250. Thus if a ground or power connection is provided to layer 214, this ground or power connection is then provided to the die through bonding wire 250. If the connection between an embedded plane within substrate or member 24 and a metallic layer 214 is undesirable, it may be separated from the metallic layer, such as shown for plane 232 in FIG. 17.

The invention has been described above in reference to various embodiments. It will be understood that various modifications may be made without departing from the scope of the invention which is to be limited only by the appended claims.

What is claimed is:

1. An integrated circuit die-to-lead frame interconnect assembly having four sides, comprising:
   a semiconductor die;
   a unitary lead frame having a plurality of electrically conductive leads extending outwardly from all four sides of the assembly, said leads arranged in four arrays, one array on each side of the assembly, said leads having inner end portions extending inwardly towards the die on said four sides, said end portions separated from the die by gaps;
   an insulating bridging and support member supporting the die, said member having electrically conductive traces on said four sides for bridging the gaps; and
   means for electrically connecting the traces to the die;
   wherein said member has a plurality of edges, one of said edges corresponding to each array of leads, said inner end portions of the leads in each array extending over or under the corresponding edge of the member over staggered distances forming a staggered arrangement, said member further comprising a plurality of connecting structures, said structures located adjacent to and at different distances from said edges forming staggered arrangements so that each structure matches in position and is attached to an inner lead end portion in the staggered arrangements of the inner lead portions, each structure also electrically connected to a trace and electrically connected to and attached to a corresponding lead so that the die and the member are supported by the lead frame, and so that the die is electrically connected to the leads, each structure formed with sides for locating transverse protrusions at the inner end portion of the lead of each array to which it is attached.

2. The assembly of claim 1, said leads having inner end portions near the die and outer lead portions away from the die, wherein the die, the member, the connecting means and the leads except for outer end portions of the leads are encapsulated by a package housing, and wherein the outer lead end portions are bent with respect to the remaining portions of the leads so that said outer lead end portions are substantially coplanar suitable for being mounted flat onto a surface.

3. The assembly of claim 1, wherein said staggered arrangement of said structures is two or more rows of structures, said rows being substantially parallel to the said at least one edge.

4. The assembly of claim 1, wherein the cross-sectional dimensions of the rods are not larger than about 0.5 mm or 20 mils.

5. The assembly of claim 1, wherein the leads from the outer to inner end portions are in the shape of straight rods of substantially the same cross-sectional dimensions.

6. The assembly of claim 5, wherein the rods are arranged in an array and are substantially parallel to one another.

7. The assembly of claim 1, said structures being holes, slots or shoulders with grooves therein.

8. The assembly of claim 7, said holes, slots or grooves have cross-sectional dimensions less than about 20 mils.

9. The assembly of claim 1, each of said leads having a bent portion and a main body portion, said bent portion forming an angle of less than 180° with said main body portion, said bent portion engaging a corresponding one of said structures, said assembly further comprising means for electrically connecting and physically attaching said bent portion to the structure.

10. The assembly of claim 9, said structures being holes, slots or shoulders with grooves therein, said bent portions of leads being placed inside the holes, slots or abutting the shoulder at the grooves.

11. The assembly of claim 9, wherein said bent portion forms an angle of about 90° with the main body portion.

12. The assembly of claim 9, wherein said bent portion forms an angle of greater than 90° with the main body portion.

13. The assembly of claim 9, wherein said bent portion forms with the main body portion a J-shaped rod.

14. The assembly of claim 1, wherein said member is flexible.

15. The assembly of claim 14, wherein said member has a pair of oppositely situated edges and at least two sets of structures, one set adjacent to one edge and the other set adjacent to the other edge, said lead frame having at least two sets of leads on opposite sides of the member, each set passing over or under one of the edges to engage one of the two sets of structures so that the member is suspended and maintained in position by the two sets of leads.

16. The assembly of claim 1, wherein said member is flexible or is a rigid printed circuit board or polyimide tape.

17. The assembly of claim 1, wherein said electrically connecting means includes bonding wires connecting the die to the traces.

18. The assembly of claim 1, wherein said electrically connecting means includes contact pads on the die, contacts on the member, each contact on the member corresponding to a contact pad on the die, and a solder material bonding or thermal compression bonding each of the contact pads on the die to a corresponding contact on the member.

19. The assembly of claim 1, wherein said inner end portions of the leads are in the shape of unitary elongated rods.

20. A method for interconnecting an integrated circuit die to a lead frame, comprising:

forming a unitary lead frame having four sides with four arrays of leads extending outwardly from said four sides, each array located on a corresponding side, said leads having inner end portions that are bent, said leads in an array extending inwardly towards a central location for the die from the corresponding side over staggered distances between adjacent leads so that the bent ends form a staggered arrangement;

providing a member with edges, electrically conductive traces and a plurality of connecting structures, each structure electrically connected to a trace, wherein for at least one edge, the structures are located adjacent to said one edge at different distances from said one edge forming a staggered arrangement that is substantially the same as the staggered arrangement of the bent ends, each structure formed with sides for locating transverse protrusions at an inner end portion of a lead of each array;

aligning the lead frame and the member so that each structure matches in location a corresponding bent end;

moving the lead frame or the member so that each structure is in contact with its corresponding bent lead end;

attaching and electrically connecting each lead end to its corresponding structure;

attaching the die onto the member; and electrically connecting the die to the traces on the member.

21. The method of claim 20, wherein said attaching and electrically connecting step includes electrodeless plating onto said each lead and its corresponding structure.

22. The method of claim 21, wherein said attaching and electrically connecting step includes thermal compression bonding each lead to its corresponding structure.

23. The method of claim 20, wherein said member includes solder material at or near each structure, and wherein said attaching and electrically connecting step includes reflowing said solder material to attach and connect each lead to its corresponding structure.

* * * * *